US009773531B2

(12) United States Patent
Yoon et al.

(10) Patent No.: US 9,773,531 B2
(45) Date of Patent: Sep. 26, 2017

(54) ACCESSING MEMORY

(75) Inventors: Doe Hyun Yoon, San Jose, CA (US); Naveen Muralimanohar, Santa Clara, CA (US); Jichuan Chang, Sunnyvale, CA (US); Parthasarathy Ranganthan, San Jose, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 272 days.

(21) Appl. No.: 14/405,904

(22) PCT Filed: Jun. 8, 2012

(86) PCT No.: PCT/US2012/041675
§ 371 (c)(1),
(2), (4) Date: Dec. 5, 2014

(87) PCT Pub. No.: WO2013/184139
PCT Pub. Date: Dec. 12, 2013

(65) Prior Publication Data

US 2015/0302904 A1 Oct. 22, 2015

(51) Int. Cl.
*G06F 12/08* (2016.01)
*G06F 12/0808* (2016.01)
(Continued)

(52) U.S. Cl.
CPC ........ *G11C 7/1072* (2013.01); *G06F 13/1663* (2013.01); *G11C 5/04* (2013.01);
(Continued)

(58) Field of Classification Search
CPC ...... G06F 9/4843; G06F 9/52; G06F 11/1044; G06F 11/1048; G06F 11/1076;
(Continued)

(56) References Cited

U.S. PATENT DOCUMENTS 5,613,088 A * 3/1997 Achiwa .............. G06F 11/1076 360/53
6,034,900 A 3/2000 Shirley et al.
(Continued)

OTHER PUBLICATIONS

Hegde, A. et al., "VL-CDRAM: Variable line Sized Cached DRAMs"—CODES+ISSS '03 pp. 132-137, 2003.
(Continued)

*Primary Examiner* — Daniel C Chappell
*Assistant Examiner* — Mohamed Gebril
(74) *Attorney, Agent, or Firm* — Hanley Flight & Zimmerman, LLC

(57) ABSTRACT

A disclosed example method involves performing simultaneous data accesses on at least first and second independently selectable logical sub-ranks to access first data via a wide internal data bus in a memory device. The memory device includes a translation buffer chip, memory chips in independently selectable logical sub-ranks, a narrow external data bus to connect the translation buffer chip to a memory controller, and the wide internal data bus between the translation buffer chip and the memory chips. A data access is performed on only the first independently selectable logical sub-rank to access second data via the wide internal data bus. The example method also involves locating a first portion of the first data, a second portion of the first data, and the second data on the narrow external data bus during separate data transfers.

14 Claims, 10 Drawing Sheets

(51) Int. Cl.
*G06F 12/0815* (2016.01)
*G11C 7/10* (2006.01)
*G11C 5/04* (2006.01)
*G06F 13/16* (2006.01)

(52) U.S. Cl.
CPC .................. *G11C 2207/108* (2013.01); *G11C 2207/2209* (2013.01); *G11C 2207/2281* (2013.01); *Y02B 60/1228* (2013.01)

(58) Field of Classification Search
CPC . G06F 12/0828; G06F 12/0835; G11C 29/56; G11C 29/808; G11C 5/06; G11C 5/14; G11C 7/02; G11C 7/10; G11C 7/1027; G11C 7/1045; G11C 7/1048; G11C 7/1051; G11C 7/1066; G11C 7/1069; G11C 7/1078; G11C 7/1087; G11C 8/10; G11C 2207/108
USPC .......................................... 711/105, 113, 141
See application file for complete search history.

(56) References Cited

U.S. PATENT DOCUMENTS 6,138,219 A 10/2000 Soman et al.
6,212,597 B1 4/2001 Conlin et al.
6,256,713 B1 * 7/2001 Audityan ................ G06F 13/18 711/141
6,782,410 B1 * 8/2004 Bhagat .................. G06F 9/5027 709/201
6,842,377 B2 * 1/2005 Takano ................ G11C 7/1021 365/185.21
7,017,011 B2 * 3/2006 Lesmanne ............. G06F 12/082 711/141
7,196,942 B2 * 3/2007 Khurana .............. G11C 7/1051 326/38
7,269,715 B2 * 9/2007 Le ......................... G06F 9/3802 712/215
7,321,955 B2 * 1/2008 Ohmura .............. G06F 12/0804 711/113
7,512,736 B1 * 3/2009 Overby ................. G06F 3/0607 707/999.202
7,599,205 B2 10/2009 Rajan
8,230,193 B2 * 7/2012 Klemm ................. G06F 3/0608 711/114
8,335,894 B1 * 12/2012 Rajan ...................... G06F 12/00 711/154
8,566,546 B1 * 10/2013 Marshak ............... G06F 3/0604 711/112
8,990,527 B1 * 3/2015 Linstead ............... G06F 3/0617 711/161
9,432,298 B1 * 8/2016 Smith ................. H04L 49/9057
2004/0044878 A1 * 3/2004 Evans ................... G06F 9/3842 712/34
2004/0068621 A1 * 4/2004 Van Doren ......... G06F 12/0828 711/144
2005/0125607 A1 * 6/2005 Chefalas ............. G06F 12/0862 711/113
2005/0289317 A1 12/2005 Liou et al.
2007/0008328 A1 * 1/2007 MacWilliams ..... G06F 12/0646 345/530
2007/0070669 A1 * 3/2007 Tsern ....................... G11C 5/02 365/51
2008/0020717 A1 1/2008 Marholev et al.
2008/0162991 A1 7/2008 Dell et al.
2009/0031078 A1 1/2009 Warnes et al.
2009/0063785 A1 3/2009 Gower et al.
2009/0094413 A1 * 4/2009 Lehr ..................... G06F 3/0605 711/112
2009/0228648 A1 * 9/2009 Wack .................. G06F 11/1092 711/114
2009/0282101 A1 * 11/2009 Lim ...................... G06F 9/5077 709/203
2010/0037117 A1 2/2010 Pescatore
2010/0046267 A1 * 2/2010 Yan ........................ G11C 16/24 365/51
2010/0050016 A1 * 2/2010 Franklin ............. G06F 11/0727 714/6.32
2010/0125712 A1 * 5/2010 Murase ............... G06F 11/1458 711/162
2010/0146199 A1 6/2010 Shaeffer et al.
2010/0332780 A1 * 12/2010 Furuya .................. G06F 3/0689 711/162
2011/0202735 A1 * 8/2011 Kono .................. G06F 11/1451 711/162
2011/0307745 A1 * 12/2011 McCune ........... G06F 17/30221 714/54
2012/0198107 A1 * 8/2012 McKean ................. G06F 13/18 710/40
2013/0007373 A1 * 1/2013 Beckmann ............ G06F 12/126 711/136
2013/0067161 A1 * 3/2013 Chandra ................. G06F 13/12 711/114
2013/0080805 A1 * 3/2013 Vick ..................... G06F 8/4432 713/320
2013/0111129 A1 * 5/2013 Maki ..................... G06F 3/0611 711/117
2013/0152097 A1 * 6/2013 Boctor .................... G06F 9/505 718/103
2013/0326270 A1 * 12/2013 Chen ................... G06F 11/2089 714/6.21
2014/0003114 A1 * 1/2014 Pellizzer ............. H01L 27/2481 365/63

OTHER PUBLICATIONS

Park, W-C. et al., "A Processor Architecture with Effective Memory System for Sort-last Parallel Rendering" ~ARCS~ pp. 160-175, 2006.
PCT Search Report/Written Opinion~ Application No. PCT/US2012/0411675~ dated Jan. 25, 2013~ 9 pages.

* cited by examiner

ACCESSING MEMORY

STATEMENT OF GOVERNMENT INTEREST

This invention has been made with government support under Contract No. DE-SC0005026, awarded by The Department of Energy. The government has certain rights in the invention.

BACKGROUND

Increases in device scaling and emerging chip-multi processor (CMP) architectures demand greater throughput, power consumption, and reliability from memory systems. Newer generations of dynamic random access memory (DRAM) are designed to provide higher throughput by employing n-bit prefetch and burst access capabilities combined with high-speed signaling techniques. As DRAM channel frequencies increase, adding more ranks or modules deteriorates signal integrity, which limits total memory capacity. A technique for overcoming slow memory access times involves using bank-level parallelism in which multiple memory accesses are issued to different banks of a DRAM to hide DRAM latency. As DRAM dock frequencies increase, switching ranks results in idle cycles on data buses, which introduces time delays between data outputs. This leads to undesirable bus utilization performance of DRAM data buses.

DETAILED DESCRIPTION

Example methods, apparatus, and articles of manufacture disclosed herein may be used to access memories. The disclosed examples may be used to implement a wide internal data bus in a dynamic random access memory (DRAM) module (or on a main printed circuit board (PCB) having DRAM chips) to access memory chips or logical memory ranks of the DRAM module, and a relatively narrower external data bus for exchanging data between the DRAM module and external devices (e.g., memory controllers). The disclosed examples are useful to increase DRAM module capacities while improving performance, power, and reliability. In the disclosed examples, the wide internal data bus is operable at a relatively slower speed than the narrower external data bus, enabling the use of low-power, low-frequency, and low cost DRAM chips on a memory module while supporting external data access speeds of high-performance DRAM interfaces for external devices in communication with the memory module. To support such high-performance DRAM interfaces using lower-performance DRAM chips, examples disclosed herein use memory interface translation techniques to enable retrieving data from the DRAM chips on the wide internal data bus using low-frequency interface standards and supplying that same data on the narrower external data bus using higher-frequency memory interface standards. Although some specific example memory interface standards are described herein for internal and external data buses, the disclosed examples are not limited for use with such specific memory interface standards. Instead, the disclosed examples may be adapted for use with other memory interface standards operating at different frequencies and/or offering different data access features.

Figure 1:
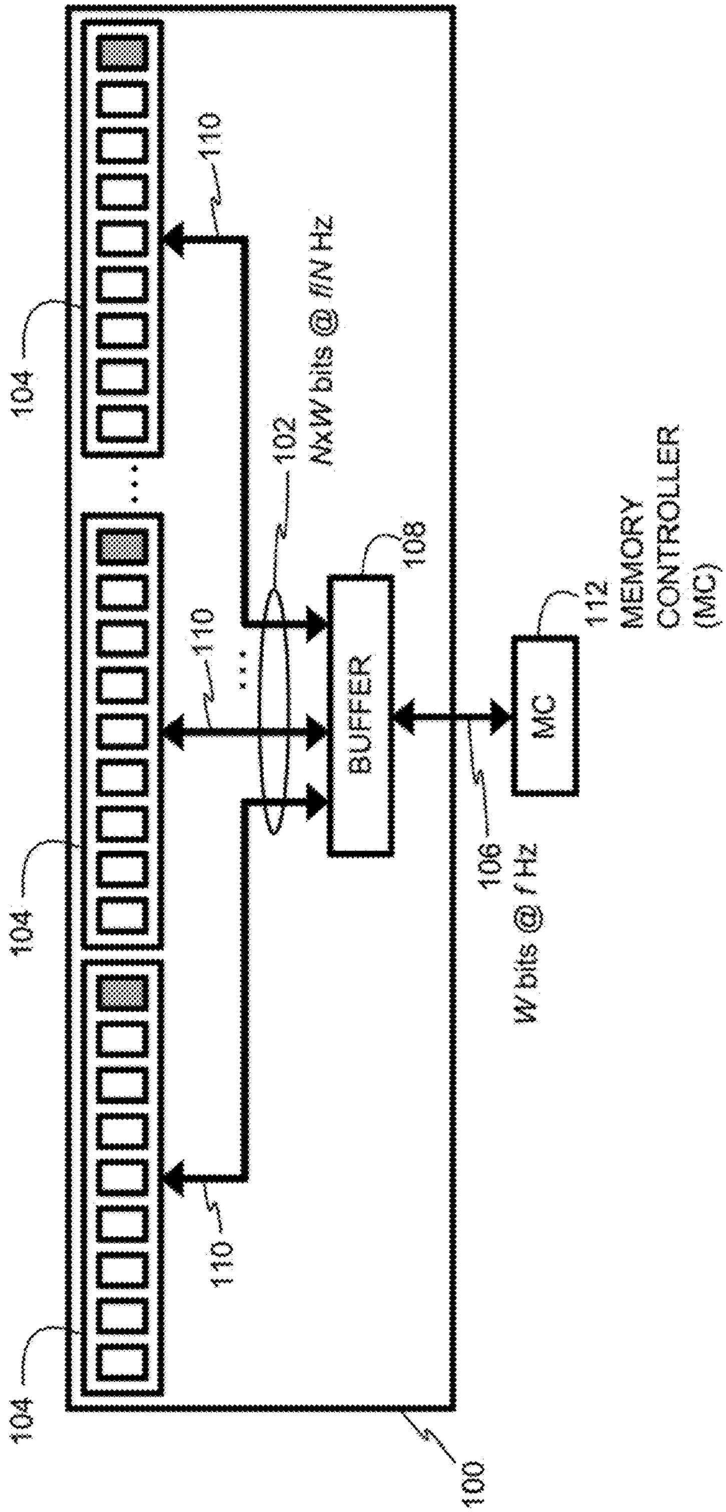
FIG. 1 is an example memory module having a wide internal data bus and a narrow external data bus.

FIG. 1 is an example memory module 100 having a wide internal data bus 102 to access multiple physical memory ranks 104, a relatively narrower external data bus 106, and a translation buffer chip 108. In the illustrated example, the narrow external data bus 106 is (W) bits wide and operates at a frequency of (f) Hertz (Hz), providing data access speeds of Wf bits/sec for interfacing with the memory module 100. The wide internal data bus 102 is (N)×(W) bits wide and operates at a frequency of (f)/(N) Hz, where (N) is the quantity of the physical memory ranks 104 per logical rank located on the memory module 100. In this manner, the wide internal data bus 102 provides the same bandwidth as the narrow external data bus 106. By using lower frequencies on the wide internal data bus 102, the DRAM chips in the physical memory ranks 104 can be low-power, low-frequency, and low-cost memory chips, while the memory module 100 can operate as a high-performance memory with high-speed access speeds at the narrow external data bus 106. In some examples, the physical memory ranks 104 may form a logical memory rank, and other physical memory ranks (not shown) of the memory module 100 may form one or more other logical memory ranks.

In the illustrated example of FIG. 1, internal narrower data buses 110 form different portions of the wide internal data bus 102 such that the width (e.g., bit length) of the wide internal data bus 102 is equal to the sum of the widths of all the internal narrower data buses 110. Each of the internal narrower data buses 110 of the illustrated example is the width of the narrow external data bus 106. Accessing data on the wide internal data bus 102 involves fetching data on one or more of the multiple internal narrower data buses 110 simultaneously from corresponding ones of the physical memory ranks 104. When data is fetched on the wide internal data bus 102 from four internal narrower data buses 110 simultaneously, the data is accessed on the narrow external data bus 106 as four consecutive data output cycles because the amount of data fetched on the wide internal data bus 102 is four times the width of the narrow external data bus 106. In such examples, the wide internal data bus 102 can operate four times slower than the narrow external data bus 106.

In the illustrated example, a physical memory rank (e.g., one of the physical memory ranks 104) is a memory area that is accessed using one of the internal narrower data buses 110. A single physical memory rank 104 may be formed by one or more memory chips. For example, if each of the internal narrower data buses 110 is thirty-two bits wide, each physical memory rank 104 can be a single 32-bit wide memory chip, two 16-bit wide memory chips, or four 8-bit wide memory chips.

The translation buffer chip 108 of the illustrated example translates data exchanges between the wide internal data bus 102 and the narrow external data bus 106 so that slower data accesses on the wide internal data bus 102 can be used to provide high-speed data accesses on the narrow external data bus 106. In the illustrated example, the translation buffer chip 108 is in communication with an example memory controller 112. In examples disclosed herein, the memory controller 112 may be configured to interface with the memory module 100 using a high-performance DRAM interface (e.g., dual data rate, version 3, (DDR3) DRAM operating at 1600 MHz) even though the physical memory ranks 104 are implemented using low-power chips having low-speed interfaces (e.g., mobile DRAM such as low-power DDR2 (LPDDR2) DRAM operating at 400 MHz).

In the illustrated example, the translation buffer chip 108 and memory chips forming the physical memory ranks 104 are located on a DRAM dual inline memory module (DIMM). In other examples, the translation buffer chip 108 and the memory chips forming the physical memory ranks 104 may be arranged in a three-dimensional (3D) stack chip, or may be arranged on a main processor board.

Figure 2:
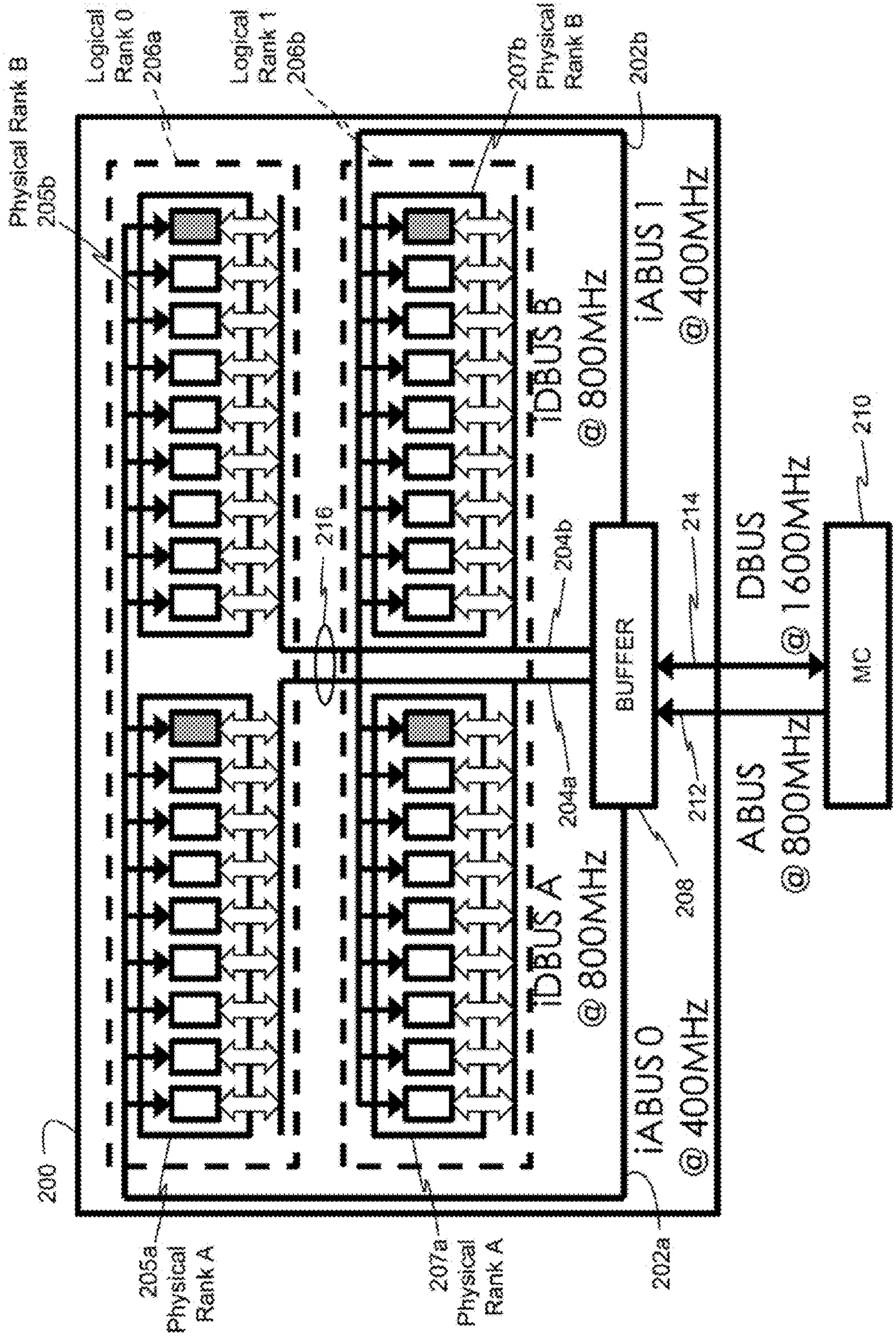
FIG. 2 shows an example memory module having two internal address buses and two internal data buses connected to two logical memory ranks.

FIG. 2 shows internal address buses 202*a-b* (iABUS 0 and iABUS 1) and internal data buses 204*a-b* (iDBUS A and iDBUS B) connected to logical memory ranks of an example memory module 200. The example memory module 200 is configured using an N2 architecture, meaning that a logical memory rank includes two physical memory ranks (i.e., N=2 physical ranks). In the illustrated example of FIG. 2, a logical rank 206*a* (logical rank 0) includes two physical ranks 205*a* (physical rank A) and 205*b* (physical rank B), and a logical rank 206*b* (logical rank 1) includes two physical ranks 207*a* (physical rank A) and 207*b* (physical rank B). The physical ranks A 205*a* and 207*a* share the internal data bus 204*a* (iDBUSA), and the physical ranks B 205*b* and 07*b* share the internal data bus 204*b* (iDBUSB). The memory module 200 of the illustrated example includes a translation buffer 208 in communication with the logical ranks 206*a-b* through the internal address buses 202*a-b* and the internal data buses 204*a-b*. The translation buffer 208 communicatively couples the memory module 200 with an example memory controller 210 through an external address bus 212 and a narrow external data bus 214.

The internal address bus 202*a* (iABUS 0) of the illustrated example controls the first logical rank 206*a* (logical rank 0) independent of the second logical rank 206*b* (logical rank 1), and the internal address bus 202*b* (iABUS 1) of the illustrated example controls the second logical rank 206*b* (logical rank 1) independent of the first logical rank 206*a* (logical rank 0). This provides a higher internal address bus bandwidth by being able to control the logical ranks 206*a-b* independent of one another, and also reduces electrical load on the internal address buses 202*a-b*.

In the Illustrated example, the internal data buses 204*a-b* are combined to form a wide internal data bus 216. The width of each internal data bus 204*a-b* is equal to the width of the narrow external data bus 214. As such, the width of the wide internal data bus 216 is twice the width of the narrow external data bus 214. In examples having more physical ranks per logical rank, the width of the wide internal data bus is more than twice the width of the narrow external data bus 214. In the illustrated example, a single data access on the wide internal data bus 216 from the logical ranks 206*a-b* simultaneously locates a first portion of the data on the internal data bus 204*a* and a second portion of the data on the internal data bus 204*b*. The single data access on the wide internal data bus 216 involves two data accesses on the narrow external data bus 214. In this manner, the logical ranks 206*a-b* and the wide internal data bus 216 may operate at half the frequency of the narrow external data bus 214. Memory accesses between the memory controller 210 and the memory module 200 can be performed using a relatively higher performance memory standard (e.g., the narrow external data bus 214 at 1600 MHz, and the external address bus 212 at 800 MHz), while memory accesses internal to the memory module 200 can be performed using a relatively lower performance memory standard (e.g., the internal data buses 204*a-b* at 800 MHz, and the internal address buses 202*a-b* at 400 MHz). This enables constructing the memory module 200 using low-frequency, low-power, low-cost memory, while providing a high-performance memory interface to the memory module 200.

In the illustrated example, the internal data buses 204*a-b* (iDBUS A and iDBUS B) of FIG. 2 may be used to implement the internal narrow data buses 110 of FIG. 1, one or both of the logical ranks 206*a-b* of FIG. 2 may be used to implement one or more logical ranks that include the physical ranks 104 of FIG. 1 and/or other physical ranks not shown in FIG. 1, the translation buffer 208 of FIG. 2 may be used to implement the translation buffer chip 108 of FIG. 1, the wide internal data bus 216 of FIG. 2 may be used to implement the wide internal data bus 102 of FIG. 1, the narrow external data bus 214 of FIG. 2 may be used to implement the narrow external data bus 106 of FIG. 1, and the memory controller 210 of FIG. 2 may be used to implement the memory controller 112 of FIG. 1.

Although the example memory module 200 is shown as an N2 architecture, configurations with more physical ranks per logical rank may be implemented using additional separate internal address and data buses. For example, an N4 architecture may be implemented using four internal address buses and four internal data buses in which the internal memory chips operate at one-fourth the frequency of the external data bus (e.g., the narrow external data bus 214). An N8 architecture may be implemented using eight internal address buses and eight internal data buses in which the internal memory chips operate at one-eighth the frequency of the external data bus ((e.g., the narrow external data bus 214).

Figure 3:
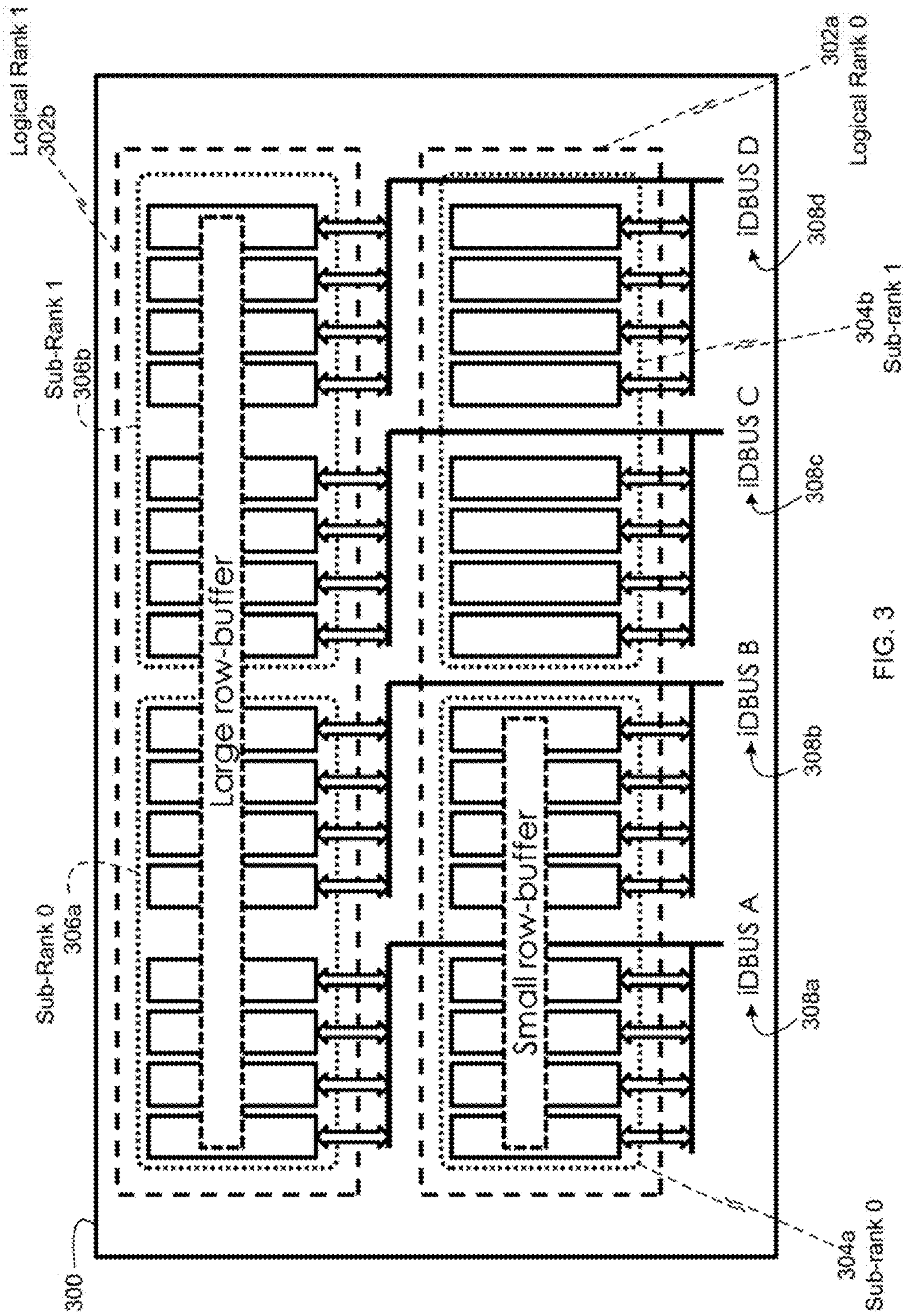
FIG. 3 is an example memory module having logical memory ranks with independently selectable logical sub-ranks.

FIG. 3 is an example memory module 300 having logical memory ranks 302*a-b* (logical rank 0 and logical rank 1) with independently selectable logical sub-ranks 304*a-b* (logical sub-ranks 0 and 1 of logical rank 0) and independently selectable logical sub-ranks 306*a-b* (logical sub-ranks 0 and 1 of logical rank 1). Internal data buses 308*a* (iDBUS A), 308*b* (iDBUS B), 308*c* (iDBUS C), and 308*d* (IDBUS D) are shown connected to the logical ranks 302*a-b* and sub-ranks 304*a-b* and 306*a-b*. In the illustrated example, each of the internal data buses 308*a-d* is a portion of a wide internal data bus (e.g., the wide internal data bus 102 of FIG. 1) such that the width of the wide internal data bus is equal to the sum of widths of all the internal data buses 308*a-d*. Although not shown, the example memory module 300 also includes four internal address buses (iABUSes) routed to each logical sub-rank 304*a-b* and 306*a-b*. The internal data buses 308*a-b* and internal address buses (not shown) are connected between the logical ranks 302*a-b* and a translation buffer (e.g., the translation buffer chip 108 of FIG. 1). The memory module 300 of the illustrated example may be used to implement the memory module 100 of FIG. 1 such that one or more of the logical ranks 302*a-b* of FIG. 3 may be used to implement one or more logical ranks that include one or more of the physical ranks 104 of FIG. 1 and/or other physical ranks not shown in FIG. 1, and the internal data buses 308*a-d* of FIG. 3 may be used to implement the internal data buses 110 of FIG. 1.

The independent selectability of the logical sub-ranks 304*a-b* and 306*a-b* decreases the access granularity of the wide internal data bus formed by the internal data buses 308*a-d* and decreases activate/precharge power. For example, without increasing access granularity as enabled by the memory module 300 of FIG. 3, memory access requests to N4 architectures are served using 4×64-bit words×burst 8 words=128 bytes (B) (this number increases for N8 architectures), and an activate command fetches four times more bits to row buffers. However, unless a memory controller (e.g., the memory controller 112 of FIG. 1) actually accesses all of the activated bits, the memory module 300 has wasted power and energy in accessing the activated but unused bits.

To avoid wasting of power and energy due to accessed but unused bits, the independent selectability of the logical sub-ranks 304*a-b* and 306*a-b* in the memory module 300 of the illustrated example enables accessing only a part of the larger logical ranks 302*a-b* so that only the portion of bits that are desired from a row buffer are retrieved from the logical ranks 302*a-b*. Thus, in some examples, the memory module 300 may be accessed to retrieve a large width of data from a large row-buffer as shown in FIG. 3 as an access to both logical sub-ranks 306*a-b* of the second logical rank 302*b* (i.e., an access to all of the memory chips in the second logical rank 302*b*). In such examples, different portions of the data are simultaneously located on different ones of the internal data buses 308*a-d*. In other examples, the memory module 300 may be accessed to retrieve a smaller width of data from a small row-buffer as shown in FIG. 3 as an access to only the first logical sub-rank 304*a* of the first logical rank 302*a* (i.e., an access to only the memory chip(s) in the first logical sub-rank 304*a* of the first logical rank 302*a*) without accessing the second logical sub-rank 304*b* of the first logical rank 302*a*. In such examples, different portions of the data are simultaneously located on the internal data buses 308*a-b* without simultaneously locating any data on the internal data buses 308*c-d* during the same data access. In the illustrated example, a small row-buffer may also be accessed by accessing only the first logical sub-rank 306*a* of the second logical rank 302*b* without accessing the second logical sub-rank 306*b* of the second logical rank 302*b*. Using this logical sub-rank selectability, the active width of the wide internal data bus of the memory module 300 is dynamic so that in some accesses the wide internal data bus has an active width equal to a small row-buffer of a single logical sub-rank (e.g., a single one of the logical sub-ranks 304*a-b* and 306*a-b*), and in some accesses the wide internal data bus has a relatively larger active width equal to a large-row buffer of an entire logical rank (e.g., the entire logical rank 302*a* or 302*b*).

Although the memory module 300 is shown as an N4 architecture memory, architectures with higher physical ranks per logical rank (e.g., N8, N16, etc.) may be similarly implemented having independently selectable logical sub-ranks. In such architectures, more width-size options of the wide internal data buses may be selected. For example, a small row-buffer access may access a single logical sub-rank, a medium row-buffer access may access two logical sub-ranks, and a large row-buffer access may access four logical sub-ranks.

Figure 4:
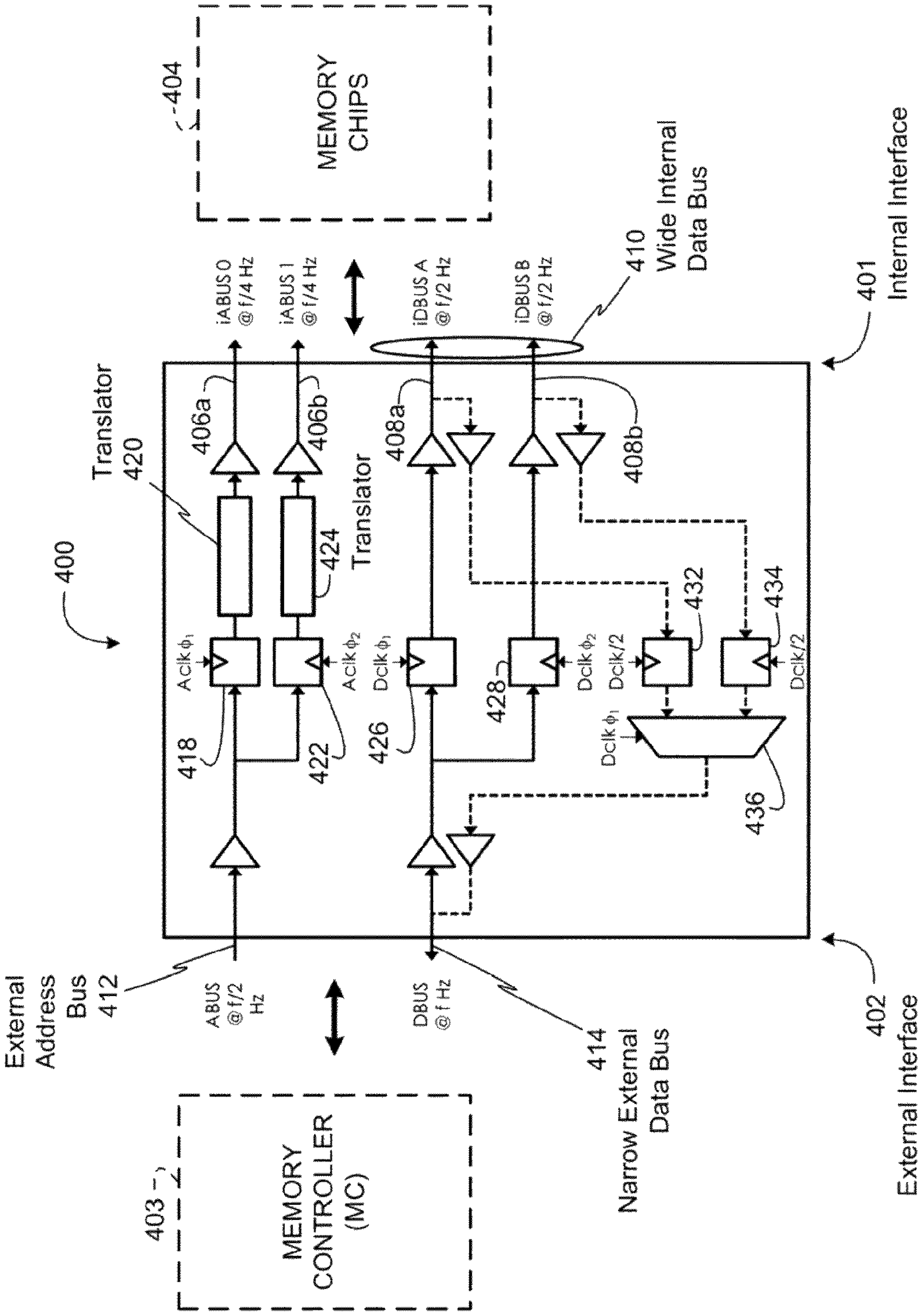
FIG. 4 is an example translation buffer that may be used with the example memory modules of FIGS. 1 and 2 to exchange data between a wide internal data bus and a narrow external data bus.

FIG. 4 is an example translation buffer 400 that may be used with the example memory modules 100 and 200 of FIGS. 1 and 2 to exchange data between an internal interface 401 having a wide internal data bus 410 (e.g., the wide internal data bus 102 of FIG. 1 or 216 of FIG. 2) and an external interface 402 having a narrow external data bus 414 (e.g., the narrow external data bus 106 of FIG. 1 or 214 of FIG. 2). The translation buffer 400 of the illustrated example may be used to implement the translation buffer chip 108 of FIG. 1 and/or the translation buffer 208 of FIG. 2. In the illustrated example, the translation buffer 400 is located between a memory controller (MC) 403 and memory chips 404. In some examples, the translation buffer 400 and the memory chips 404 are located on a memory module or memory device such as a DIMM or a 3D chip stack. In other examples, the translation buffer 400 and the memory chips 404 are co-located on a processor main board with the memory controller 403. The memory controller 403 may be the memory controller 112 of FIG. 1 and/or 210 of FIG. 2, and the memory chips 404 may implement the logical ranks 104 of FIG. 1 and/or 206*a-b* of FIG. 2.

The example translation buffer 400 is shown having an N2 architecture for which the internal interface 401 has a first internal address bus 406*a* (iABUS0) for a first logical memory rank (e.g., the first logical memory rank 206*a* of FIG. 2), a second internal address bus 406*b* (iABUS1) for a second logical memory rank (e.g., the second logical memory rank 206*b* of FIG. 2), a first internal data bus 408*a* (iDBUSA) for accessing the first physical memory ranks of logical ranks, and a second internal data bus 408*b* (iDBUSB) for accessing the second physical memory ranks of logical ranks. The internal data buses 408*a-b* are used in combination to form respective portions of the wide internal data bus 410 (e.g., similar or identical to the wide internal data bus 102 of FIG. 1 and/or the wide internal data bus 216 of FIG. 2). The external interface 402 of the example translation buffer 400 includes an external address bus 412 (ABUS) and a narrow external data bus 414 (DBUS) (e.g., similar or identical to the wide external data bus 106 of FIG. 1 and/or 214 of FIG. 2). The internal address buses 406*a-b* and the internal data buses 408*a-b* are provided to communicate with the memory chips 404, and the external address bus 412 and the narrow external data bus 414 are provided to communicate with the memory controller 403.

In the N2 architecture of FIG. 4, the narrow external data bus 414 operates at a frequency (f), the external address bus 412 operates at one-half of the frequency (f/2), the internal address buses 406*a-b* operate at one-quarter of the frequency (f/4), and the wide internal data bus 410 operates at one-half of the frequency (f/2). As such, the narrow external data bus

414 is relatively faster (twice as fast in the illustrated example) than the wide internal data bus 410.

To split the external address bus 412 into the two internal address buses 406*a-b*, the translation buffer 400 is provided with a data latch (e.g., flip-flops) 418 and a translator 420 corresponding to the first internal address bus 406*a*, and a data latch (e.g., flip-flops) 422 and a translator 424 corresponding to the second internal address bus 406*b*. In the illustrated example, the external address bus 412 provides the inputs to the data latches 418 and 422, and the translators 420 and 424 provide outputs to the internal address buses 406*a-b*. The translators 420 and 424 of the illustrated example provide address command translation logic to convert addresses and command line signals received from the memory controller 403 on the external address bus 412 into corresponding addresses and command line signals for the internal address buses 406*a-b* to access corresponding logical ranks (e.g., the logical memory ranks 206*a-b* of FIG. 2 and/or logical rank(s) that include(s) the physical ranks 104 of FIG. 1) in the memory chips 404.

To interface the narrow external data bus 414 with the wide internal data bus 410, the translation buffer 400 is provided with a data input latch (e.g., flip-flops) 426 to transfer input data from the narrow external data bus 414 to the first internal data bus 408*a*, a data input latch (e.g., flip-flops) 428 to transfer input data from the narrow external data bus 414 to the second internal data bus 408*b*, a data output latch (e.g., flip-flops) 432 to output data from the internal data bus 408*a* to the narrow external data bus 414, and a data output latch (e.g., flip-flops) 434 to output data from the internal data bus 408*b* to the narrow external data bus 414.

Each of the first and second internal data buses 408*a-b* are the same data width as the narrow external data bus 414 of the illustrated example. The data input latches 426 and 428 coordinate which data from the narrow external data bus 414 should be output to which of the internal data buses 408*a*. In the illustrated example, the translators 420 and 424 analyze addresses and control signals from the external address bus 412 and control the latches 426 and 428 to latch corresponding data words received from the memory controller 403 on the narrow external data bus 414. For example, the translators 420 and 424 may determine that data on the narrow external data bus 414 is to be latched in the latch 426 four outputting on the first internal data bus 408*a* of the wide internal data bus 410, and that data appearing immediately next on the narrow external data bus 414 is to be latched in the latch 428 for outputting on the second internal data bus 408*b* of the wide internal data bus 410. When the data is latched in corresponding ones of the latches 426 and 428, the translators 420 and 424 may cause the latches 426 and 428 to output their respective data on corresponding ones of the internal data buses 408*a-b* of the wide internal data bus 410. In this manner, the translators 420 and 424 can control the latches 426 and 428 to write data to corresponding logical memory ranks (e.g., the logical memory ranks 206*a-b* of FIG. 2 and/or logical rank(s) that include(s) the physical ranks 104 of FIG. 1).

In the illustrated example, a multiplexer 436 is coupled between the data output latches 432 and 434 and the narrow external data bus 414 to multiplex data from the wide internal data bus 410 to the narrow external data bus 414. Because the wide internal data bus 410 is twice the width of the narrow external data bus 414 in the illustrated example, data read from the memory chips 404 on the wide internal data bus 410 during a single access is output by the multiplexer 436 on the narrow external data bus 414 as two data accesses. In this manner, the wide internal data bus 410 can operate half as fast as the narrow external data bus 414. The translators 420 and 424 of the illustrated example analyze address and control signals on the external address bus 412 to control when the latches 432 and 434 are to latch data from the wide internal data bus 410 and how the multiplexer 436 arranges data from the latches 432 and 434 for outputting on the narrow external data bus 414.

Although the translation buffer 400 is shown for use with an N2 architecture memory module, the translation buffer 400 can be extended for use with larger N-based architectures (e.g., N8, N16, etc.) by adding additional data input and data output latches similar to the latches 426, 428, 432, and 434, and corresponding internal data buses similar to the internal data buses 408*a* and 408*b* to form additional portions of the wide internal data bus 410.

The latches 418, 422, 426, 428, 432, and 434, the translators 420 and 424, and the multiplexer 436 of the translation buffer 400 enable the external address bus 412 and the narrow external data bus 414 to operate using a memory interface standard between the translation buffer 400 and the memory controller 403 that is different from another memory interface standard used for the internal address buses 406*a-b* and the wide internal data bus 410 between the translation buffer 400 and the memory chips 404. The translators 420 and 424 of the illustrated example generate internal data access timings useable to perform data access on the wide internal data bus 410 between the translation buffer 400 and the memory chips 404, and external data access timings useable to perform data accesses on the narrow external data bus 414 between the memory controller 403 and the translation buffer 400.

Table 1 below shows example relatively fast memory interface standards for the external interface 402, and slower memory interface standards for the internal interface 401 based on different N-based architectures. As such, the external data access timings of Table 1 correspond to relatively faster memory access standards for operating the external interface 402 at relatively higher frequencies, and internal data access timings correspond to relatively slower memory access standards for operating the internal interface 401 at relatively slower frequencies. The memory interface standards shown in Table 1 are examples only, and examples disclosed herein are not limited to such memory interface standards and/or operating frequencies.

TABLE 1

Memory Interface Standards for External and Internal Interfaces

| External Interface 402 | Internal Interface 401 |
|---|---|
| GDDR5 @ 4 GHz | N4 architecture with DDR3 @ 1 GHz |
| GDDR5 @ 4 GHz | N8 architecture with LPDDR2 @ 500 MHz |
| DDR3 @ 1.6 GHz | N2 architecture with DDR3 @ 800 MHz |
| DDR3 @ 1.6 GHz | N4 architecture with LPDDR2 @ 400 MHz |
| LPDDR2 @ 800 MHz | N4 architecture with LPDDR @ 200 Mhz |
| Custom interface @ 20 Ghz | N4 architecture with XDR2 @ 5 GHz |
| DDR3 @ 1.6 GHz | N4 architecture with PCRAM @ 400 MHz |

The example memory interface standards of Table 1 use different data access timings for the internal interface 401 and the external interface 402 of the translation buffer 400. As shown in Table 1, in some examples, the external interface 402 can operate with external data access timings of a graphics double data rate (GDDR) DRAM (e.g., a GDDR, version five, (GDDR5) DRAM operating at four gigahertz (4 GHz)), while the internal interface 401 operates with internal data access timings for the internal interface 401 corresponding to one of a double data rate (DDR) DRAM (e.g., a DDR, version three, (DDR3) DRAM operating at one gigahertz (1 GHz)) in, for example, an N4 architecture or a low power double data rate (LPDDR) DRAM (e.g., a LPDDR, version two, (LPDDR2) DRAM operating at five hundred megahertz (500 MHz)) in, for example, an N8 architecture. As also shown in Table 1, in some examples, the external interface 402 can operate with external data access timings of a double data rate (DDR) DRAM (e.g., a DDR, version three, (DDR3) DRAM operating at one thousand six hundred megahertz (1.6 GHz)), and the internal interface 401 can operate with internal data access timings corresponding to one of a double data rate (DDR) DRAM (e.g., a DDR, version three, (DDR3) DRAM operating at eight hundred megahertz (800 MHz)); a low power double data rate (LPDDR) (e.g., a LPDDR, version two, (LPDDR2) DRAM operating at four hundred megahertz (400 MHz)); or a non-volatile memory such as, for example, a phase-change random access memory (PCRAM) (e.g., operating at four hundred megahertz (400 MHz)), a spin-torque transfer random access memory (STTRAM), or a memristor memory. As also shown in Table 1, in some examples, the external interface 402 can operate with external data access timings of a low power double data rate, version two, (LPDDR2) DRAM (e.g., operating at eight hundred megahertz (800 MHz)), and the internal interface 401 can operate at internal data access timings corresponding to a lower power double data rate (LPDDR) DRAM (e.g., operating at two hundred megahertz (200 MHz)). As also shown in Table 1, in some examples, the external interface 402 can operate with external data access timings of a custom interface (e.g., a non-industry-standard memory interface) operating at a first frequency (e.g., twenty gigahertz (20 GHz)), and the internal interface 401 can operate with internal data access timings corresponding to an industry-standard memory interface such as an extreme data rate (XDR) dynamic random access memory operating at a second frequency (e.g., five gigahertz (5 GHz)) that is relatively slower than the first frequency of the external interface 402.

Different memory interface standards have different address/command formats. For example, some standards use 1-cycle command transfers, while other standards use 2-cycle command transfers. The translators 420 and 424 enable a seamless interface between different memory technologies without needing to re-design or change memory controllers. In some examples, different translation buffers like the translation buffer 400 of FIG. 4 enable implementing a high-performance memory system (e.g., a GDDR5 memory system) using different memory modules (e.g., the memory modules 100, 200, and 300 of FIGS. 1-3) having different lower-performance memory chips that operate at different memory interface standards. For example, a translation buffer of a first memory module may translate data exchanges between LPDDR2 memory chips and the GDDR5 interface of the high-performance memory system, while another translation buffer of a second memory module may translate data exchanges between DDR3 memory chips and the GDDR5 interface of the high-performance memory system.

In the illustrated example of FIG. 4, transferring a data block on the wide internal data bus 410 and the narrow external data bus 414 uses the same amount of time, because although the wide internal data bus 410 is wider and retrieves more data per data access, it operates at a lower frequency than the narrow external data bus 414. The higher operating frequency of the narrow external data bus 414 enables it to sequentially output a first portion of data from the first internal data bus 408*a* of the wide internal data bus 410 and a second portion of the data from the second internal data bus 408*b* of the wide internal data bus 410 in the same amount of time used by the wide internal data bus 410 to retrieve the data from the memory chips 404. To illustrate this point, an example timing diagram 500 of FIG. 5 shows example timings of data transfers between the internal interface 401 (FIG. 4) and the external interface 402 (FIG. 4) using the example translation buffer 400 of FIG. 4.

Figure 5:
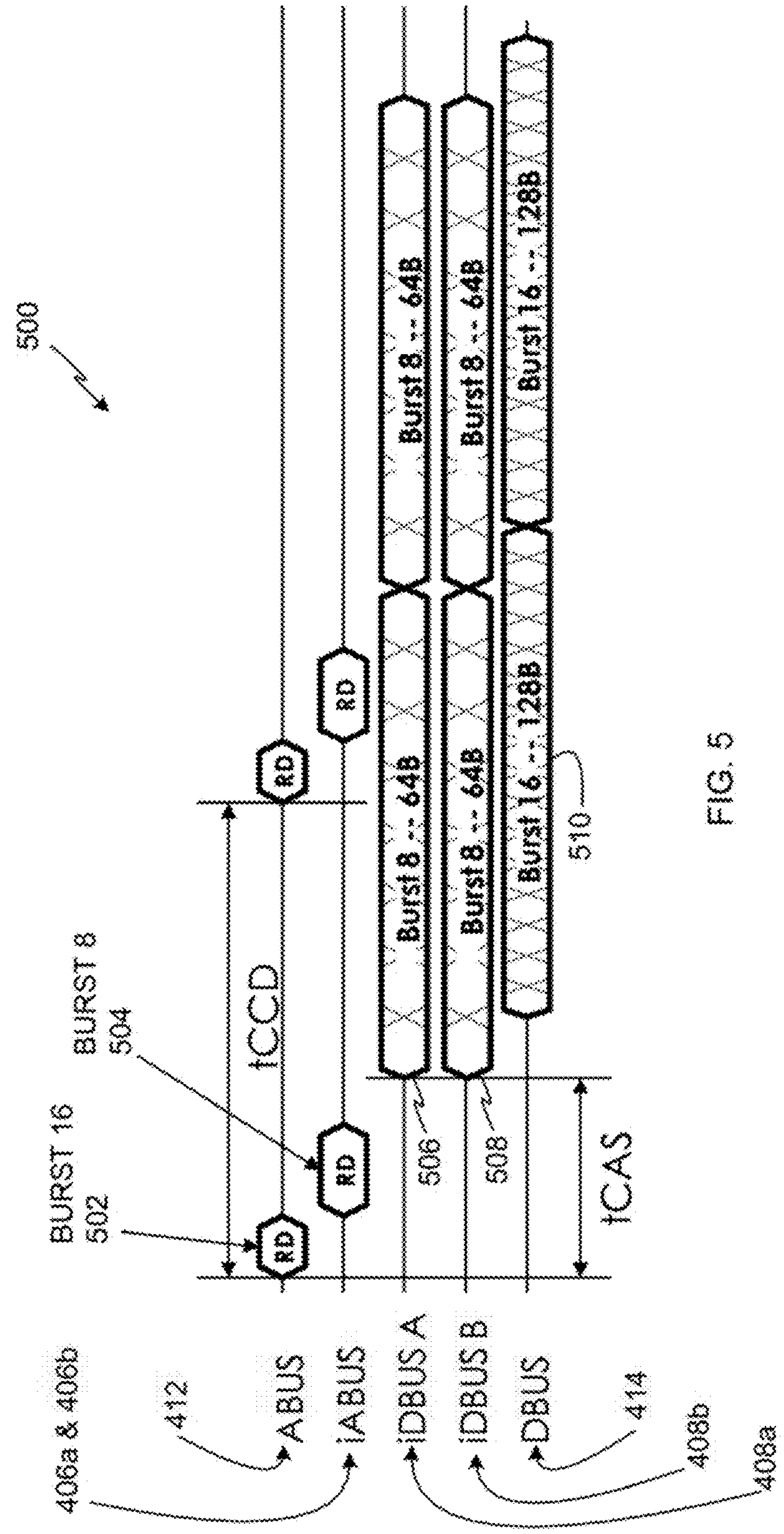
FIG. 5 is an example timing diagram showing data transfers between a wide internal data bus and a narrow external data bus using the example translation buffer of FIG. 4.

In the illustrated example of FIG. 5, the translation buffer 400 receives a burst 16 read request 502 on the external address bus 412 (ABUS). The translation buffer 400 converts the burst 16 read request 502 into two burst 8 read requests 504 for outputting on the internal address buses 406*a* and 406*b* to the memory chips 404. In the illustrated example, the memory chips 404 return a first data block of 64 bytes (B) 506 on the first internal data bus 408*a* corresponding to the burst 8 read request 504 on the first internal address bus 406*a*, and simultaneously return a second data block of 64 bytes (B) 508 on the second internal data bus 408*b* corresponding to the burst 8 read request 504 on the second internal address bus 406*b*. For example, if the memory chips 404 are implemented using the logical memory ranks 206*a* and 206*b* of FIG. 2, the first logical rank 206*a* returns the first data block of 64 bytes on the first internal data bus 408*a*, and the second logical rank 206*b* returns the second data block of 64 bytes on the second internal data bus 408*b*. In combination, the first and second data blocks 506 and 508 form respective portions of the total amount of data retrieved simultaneously on the wide internal data bus 410 of FIG. 4. As shown in FIG. 5, the translation buffer 400 generates a data output 510 of the first and second data blocks 506 and 508 on the narrow external data bus 414 the uses the same amount of time used to retrieve the first and second data blocks 506 on the wide internal data bus 410.

Figure 6:
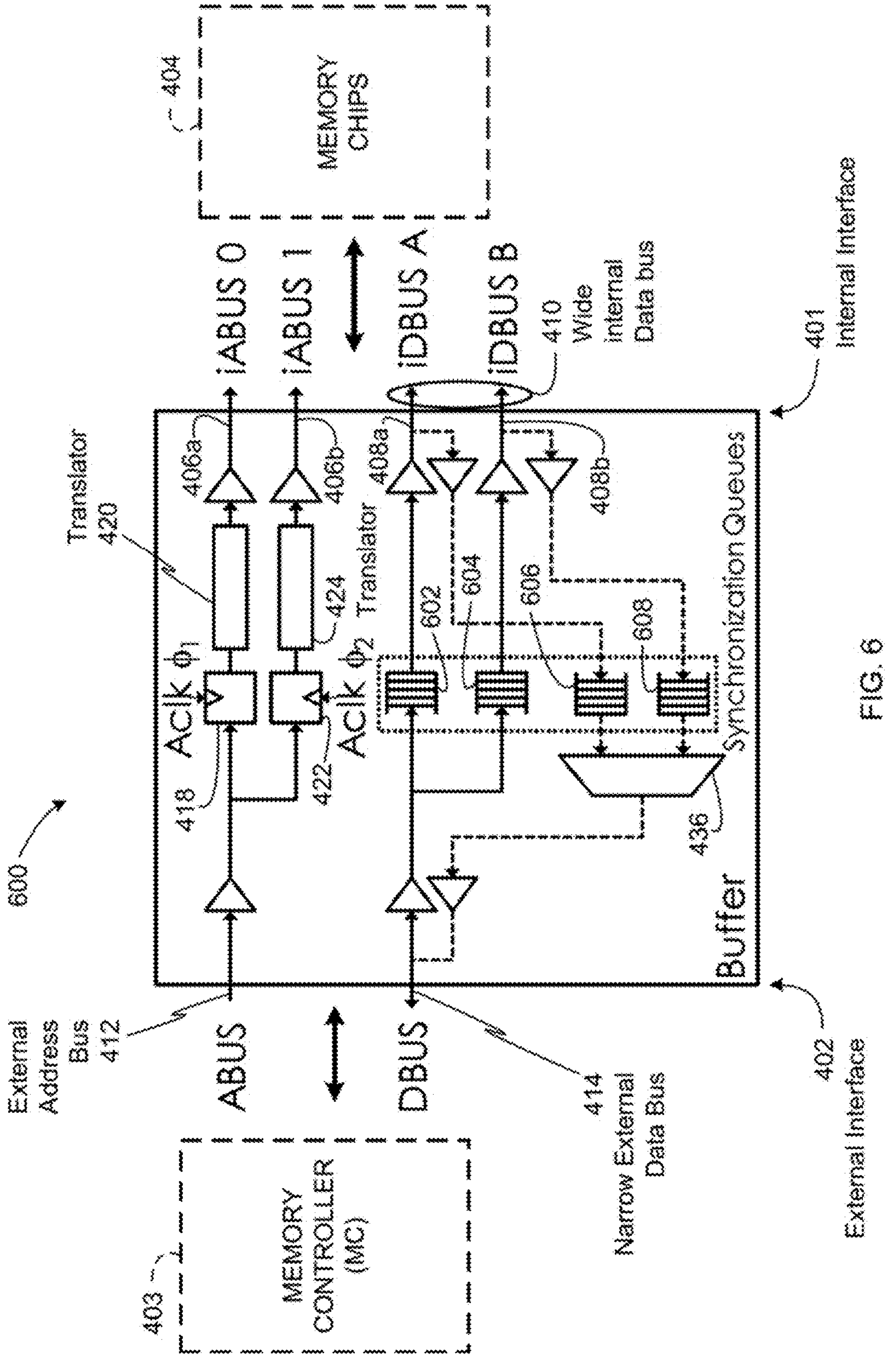
FIG. 6 is another example translation buffer that may be used with the example memory modules of FIGS. 1 and 3 to enable data transfers with independently selectable logical sub-rank memory module configurations.

FIG. 6 is another example translation buffer 600 that may be used with the example memory modules 100 and 300 of FIGS. 1 and 3 to enable data transfers with independently selectable logical sub-rank memory module configurations. Portions of the example translation buffer 600 are similar to the example translation buffer 400 of FIG. 4, and like reference numerals in FIG. 6 refer to the same or similar elements of FIG. 4. The example translation buffer 600 differs from the example translation buffer 400 in that it includes example input synchronization queues 602 and 604, and example output synchronization queues 606 and 608, which replace the latches 426, 428, 432, and 434 of FIG. 4. Unlike the latches 426, 428, 432, and 434 of FIG. 4, the synchronization queues 602, 604, 606, and 608 are used in the translation buffer 600 to better handle transfers of data blocks when there are different timings between different data blocks. Such different timings can occur in an independently selectable logical sub-rank memory module such as the example memory module 300 of FIG. 3.

In the illustrated example, the internal data bus 408*a* may be coupled to the internal data bus 308*a* (FIG. 3), and the internal data bus 408*b* may be coupled to the internal data bus 308*b* (FIG. 3). Although not shown in FIG. 6, two additional input synchronization queues (similar to the input synchronization queues 602 and 604), two additional output synchronization queues (similar to the output synchronization queues 606 and 608), and two additional corresponding internal data buses may be added to the translation buffer 600 to interface with the internal data buses 308*c* and 308*d* of FIG. 3. In this manner, the translation buffer 600 is useable with the N4 architecture memory module 300 of FIG. 3. Support for higher N-based architectures (e.g., N8, N16, etc.) may also be provided by adding additional synchronization queues and data input buffers. In addition, the translation buffer 600 may be used to translate between the different example memory interface standards shown in Table 1 above, or any other memory interface standards.

The synchronization queues 602, 604, 606, and 608 synchronize input data and output data that is subjected to different data access timings in the memory chips 404 due to different selections of logical sub-ranks (e.g., the logical sub-ranks 304*a-b* and 306*a-b* of FIG. 3). That is, data access timings are typically different when a single logical sub-rank is selected for a data access to the memory chips 404 compared to when two or more logical sub-ranks are selected for a data access to the memory chips 404. Although independently selecting different logical sub-ranks introduces different data access timings between data transfers, such independent selection is useful to reduce wasted bit retrievals. That is, when multiple logical sub-ranks are automatically accessed for each data access, bits retrieved from some logical sub-ranks may not be needed but are retrieved anyway as being part of the same accessed logical rank containing desired data. Such unneeded bits are discarded after retrieval. By independently selecting only logical sub-ranks having desired data, unneeded bits are not retrieved and, thus, data access efficiency is increased.

Figure 7:
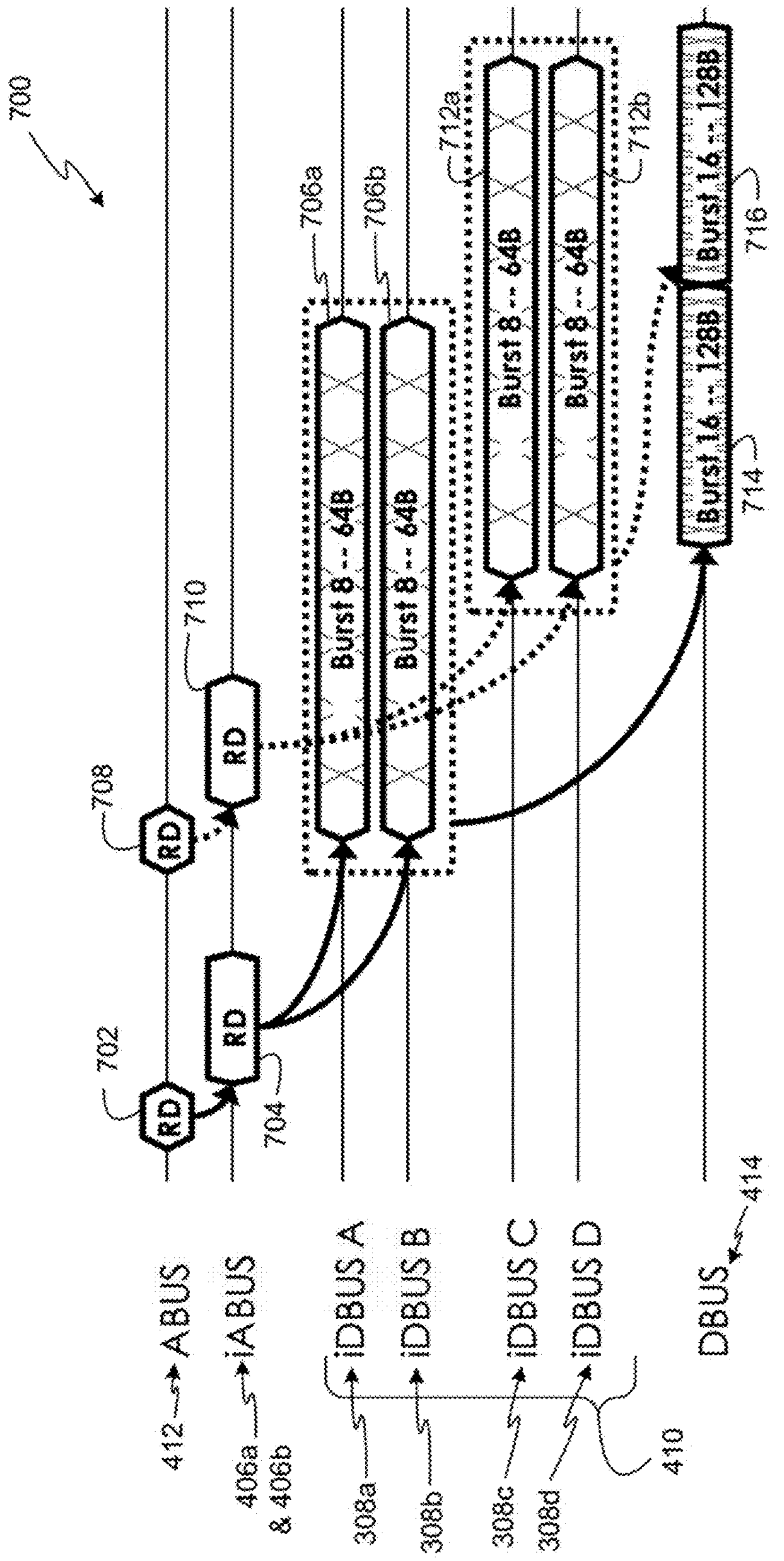
FIG. 7 is an example timing diagram showing data transfers between a wide internal data bus and a narrow external data bus using the example translation buffer of FIG. 6.

The synchronization queues 602, 604, 606, and 608 substantially decrease or eliminate the differences in access timings from propagating through from the wide internal data bus 410 to the narrow external data bus 414 by queuing and synchronizing data between the data buses 410 and 414 before completing the data transfers from the wide internal data bus 410 to the narrow external data bus 414 or from the narrow external data bus 414 to the wide internal data bus 410. An example timing diagram 700 of FIG. 7 shows data transfer timings between internal data buses 308*a-c* (FIG. 3) in communication with the wide internal data bus 410 of FIG. 6, and the narrow external data bus 414 of FIG. 6. In the illustrated example, the translation buffer 600 receives a burst 16 read request 702 on the external address bus 412, and the translators 420 and 424 convert the burst 16 read request 702 into two burst 8 read requests 704 for outputting on the internal address buses 406*a-b*. The selected logical sub-rank 304*a* or 306*a* of FIG. 3 responds by transferring two burst 8 data blocks 706*a* and 706*b* of 64 bytes each on the internal data buses 308*a* and 308*b*. The output synchronization queues 606 and 608 of FIG. 6 simultaneously receive and buffer the data blocks 706*a-b* until it is time to output the data on the narrow external data bus 414. For example, the output synchronization queue 606 buffers the first data block 706*a*, and the output synchronization queue 608 buffers the second data block 706*b*. Subsequently, the translation buffer 600 receives another burst 16 read request 708, and the translators 420 and 424 convert the burst 16 read request 708 into two burst 8 read requests 710 for outputting on the internal address buses 406*a-b*. The subsequently selected logical sub-rank 304*b* or 306*b* responds by transferring two burst 8 data blocks 712*a* and 712*b* of 64 bytes each on the internal data buses 308*c* and 308*d*. Output synchronization queues (not shown in FIG. 6) that correspond to the internal data buses 308*c* and 308*d* simultaneously receive and buffer the data blocks 712*a-b* until it is time to output the data on the narrow external data bus 414. As shown in FIG. 7, while the data blocks 706*a-b* and 712*a-b* are being received at the translation buffer 600 and queued in their respective synchronization queues, the multiplexer 436 begins outputting the data blocks 706*a-b* on the narrow external data bus 414 as a burst 16 data transfer 714 by locating the first data block 706*a* on the narrow external data bus 414 at a first time and subsequently locating the second data block 706*b* on the narrow external data bus 414 at a second time different from the first time. Similarly, while synchronization queues continue to buffer the data blocks 712*a-b* in the translation buffer 600, and when output of the burst 16 data block 714 is complete, the multiplexer 436 outputs the data blocks 712*a-b* from their respective synchronization queues on the narrow external data bus 414 as a burst 16 data block 716 in a similar manner without any delay between the burst 16 data block 714 and the burst 16 data block 716.

While example manners of implementing the translation buffers 400 and 600 have been illustrated in FIGS. 4 and 6, one or more of the elements, processes and/or devices illustrated in FIGS. 4 and/or 6 may be combined, divided, re-arranged, omitted, eliminated and/or implemented in any other way. Further, the example translators 420 and 424 and/or, more generally, the example translation buffers 400 and 600 of FIGS. 4 and 6 may be implemented by hardware, software, firmware and/or any combination of hardware, software and/or firmware. Thus, for example, any of the example translators 420 and 424 and/or, more generally, the example translation buffers 400 and 600 could be implemented by one or more circuit(s), programmable processor(s), application specific integrated circuit(s) (ASIC(s)), programmable logic device(s) (PLD(s)) and/or field programmable logic device(s) (FPLD(s)), etc. When any of the apparatus or system claims of this patent are read to cover a purely software and/or firmware implementation, at least one of the example translators 420 or 424 is hereby expressly defined to include a tangible computer readable storage medium such as a solid state memory storing the software and/or firmware. Further still, the example translation buffers 400 and 600 of FIGS. 4 and 6 may include one or more elements, processes and/or devices in addition to, or instead of, those illustrated in FIGS. 4 and 6, and/or may include more than one of any or all of the illustrated elements, processes and devices.

Figure 8:
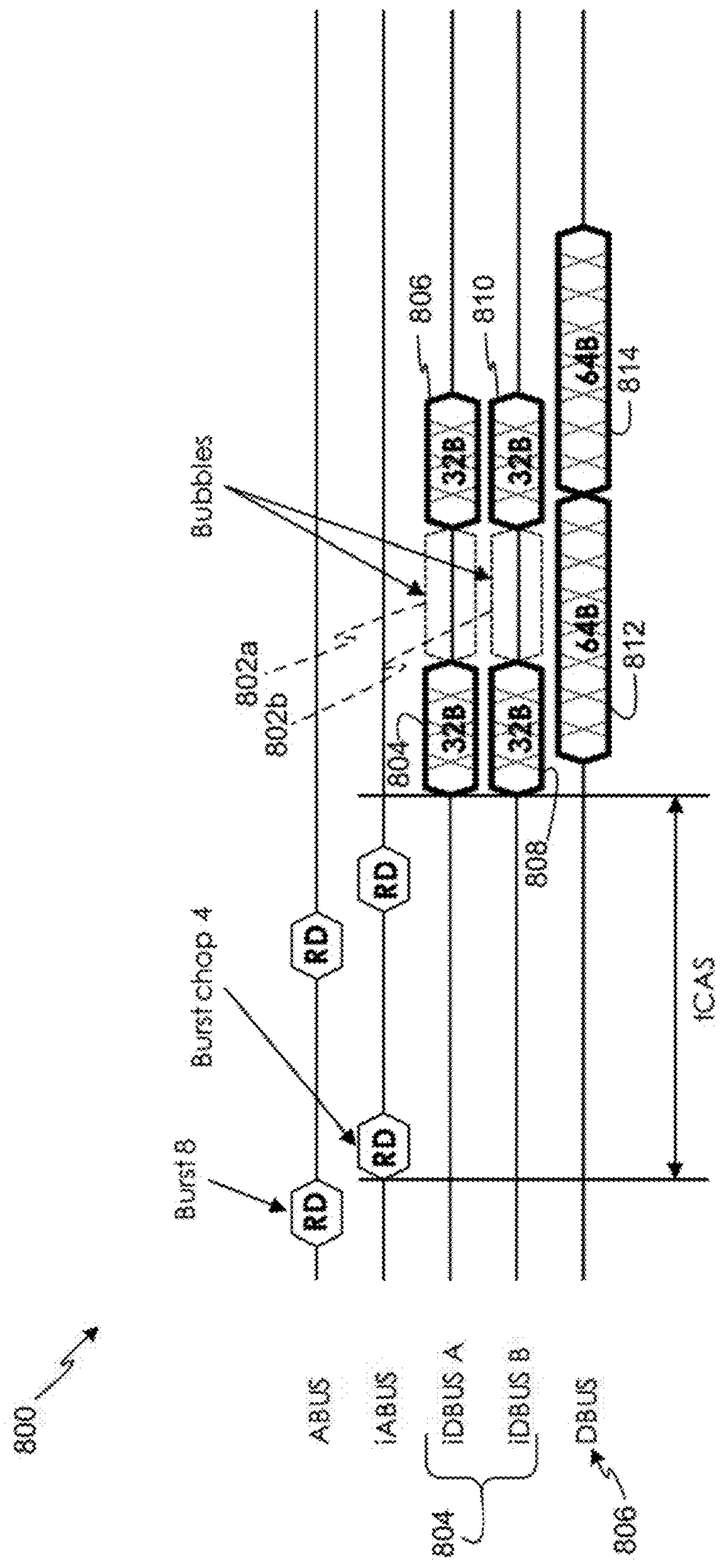
FIG. 8 is an example timing diagram showing time delay bubbles that occur on an internal data bus of a memory module during burst accesses, but are not propagated to an external data bus of the memory module.

FIG. 8 is an example timing diagram 800 for an N2 architecture showing time delay bubbles 802*a-b* that occur on a wide internal data bus (e.g., the wide internal data buses 102 of FIG. 1, 216 of FIG. 2, and 410 of FIGS. 4 and 6) of a memory module (e.g., the memory modules 100, 200, and 300 of FIGS. 1-3) during burst accesses, but do not propagate to an external data bus (e.g., the external data buses 106 of FIG. 1, 214 of FIG. 2, and 414 of FIGS. 4 and 6) of the memory module. In the illustrated example, the time delay bubbles 802*a-b* occur during a burst chop 4 (BC4) transfer mode in the DDR3 memory interface standard. The BC4 transfer mode enables transferring data using burst 4 accesses. However, this makes the DRAM chips inaccessible for a certain amount of time, which in the illustrated example is the same amount of time required to transfer a burst 4 data block. In the illustrated example, the time delay bubble 802*a* occurs between retrievals of first data 804 and second data 806 from a first logical memory rank (e.g., the logical rank 206*a* of FIG. 2 and/or 302 of FIG. 3), and the time delay bubble 802*a* occurs between retrievals of third data 808 and fourth data 810 from a second logical memory rank (e.g., the logical ranks 206*b* of FIG. 2 and/or 302*b* of FIG. 3). In some examples, the first data 804 and the third data 808 may be retrieved from the physical rank A 205*a* of FIG. 2, and the second data 806 and the fourth data 810 may be retrieved from the physical rank B 205*b* of FIG. 2. In the illustrated example of FIG. 8, the time delay bubbles 802*a-b* lead to undesirable bus utilization performance. However, using examples disclosed herein, a translation buffer such as the translation buffers 400 and 600 of FIGS. 4 and 6 can be used to prevent propagating the time delay bubbles 802*a-b* from a wide internal data bus 804 to a narrow external data bus 806.

In the illustrated example of FIG. 8, when the sum of a time delay bubble 802*a* and the time to perform a BC4 transfer on the wide internal data bus 804 matches the external transfer time for a corresponding burst 8 transfer on the narrow external data bus 806, examples disclosed herein may be used to hide or prevent propagating the time delay bubbles 802*a-b* to the narrow external data bus 806 by buffering output data 812 and 814 in data output synchronization queues (e.g., the synchronization queues 602, 604, 606, 608 of FIG. 6) as described above in connection with FIG. 6, and/or by latching the output data 812 and 814 in data output latches as described above in connection with FIG. 4. In this matter, the output data 812 (which includes the data 804 and 808) is output on narrow external data bus 806 immediately followed by the output data 814 (which includes the data 806 and 810) without any time delay between the output data 812 and the output data 814, as shown in the illustrated example of FIG. 8.

In the illustrated example, the bubble penalty is tBURST/2 when accessing the same logical memory rank, but it is tRTRS when switching between logical memory ranks every BC4 access. Typically, tBURST/2 is four DRAM clock cycles in DDR3, while tRTRS is two DRAM clock cycles in some systems (e.g., tRTRS is not a fixed parameter and can be different in different designs). Thus, if the frequency (f) (e.g., DRAM frequency) of the wide internal bus is greater than or equal to (4+2)/8×f in a memory module with internal BC4 access capabilities, the memory module provides external burst 8 access capabilities, and tRTRS is 2 cycles for the internal data bus.

Figure 9:
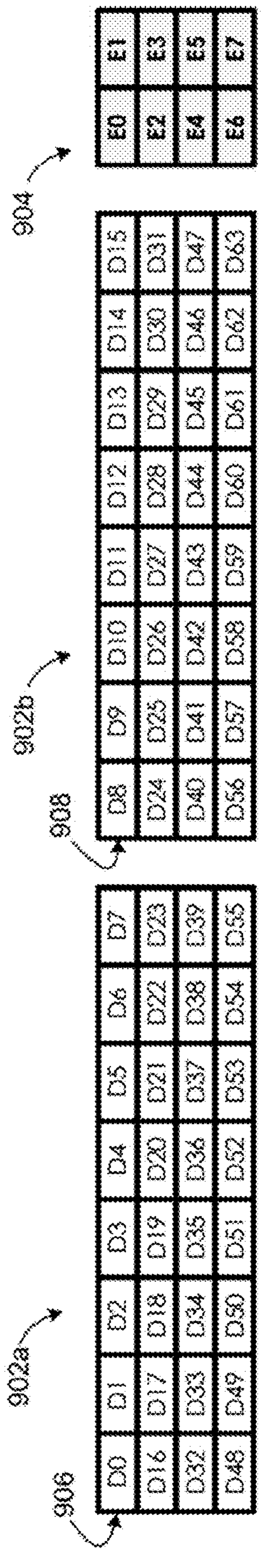
FIG. 9 is an example storage configuration for storing data and error correcting codes in a memory module.
Figure 10:
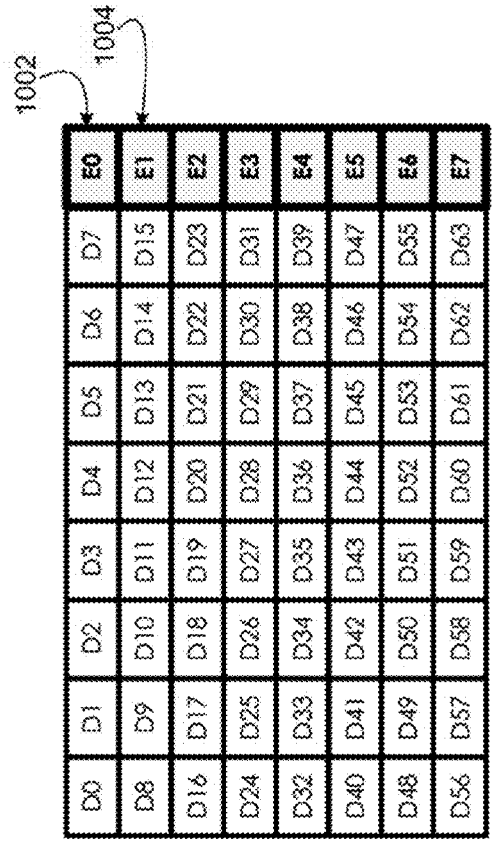
FIG. 10 is an example data transfer configuration to transfer data and corresponding error correcting codes between the translation buffers of FIGS. 4 and 6 and a memory controller.

FIG. 9 is an example storage configuration for storing data 902*a-b* and error correcting codes (ECCs) 904 in a memory module (e.g., the memory modules 100, 200, and 300 of FIGS. 1-3). FIG. 10 is an example data transfer configuration 1000 to transfer the data 902*a-b* and the corresponding ECCs 904 between the translation buffers 400 and 600 of FIGS. 4 and 6 and a memory controller (e.g., the memory controllers 112 of FIG. 1, 210 of FIG. 2, or 403 of FIGS. 4 and 6).

The example configurations of FIGS. 9 and 10 may be used to implement chipkill-correct, which is a memory protection mechanism that can tolerate a chip failure. Typically, chipkill-correct requires 128-bit wide channels. Therefore, traditional memory controllers use two 64-bit channels in lock-step mode.

The wide internal data bus architectures disclosed herein enable chipkill-correct level memory protection with a single DIMM including a narrow external data bus (e.g., the narrow external data buses 106 of FIG. 1, 214 of FIG. 2, and 414 of FIGS. 4 and 6) having a width of 64 bits. For example, an N2 architecture stores the data 902*a-b* and ECCs 904 as shown in FIG. 9. The illustrated example of FIGS. 9 and 10 assume internal burst 4 access capabilities and 8-bit DRAM chips, for which the notation Dx represents 8-bit data, and the notation Ey represents the ECCs 904. In some examples, the data 902*a* may be stored in a separate logical memory rank from the data 902*b*, and the ECCs 904 may be stored in yet another separate logical memory rank.

In the illustrated example of FIG. 10, the translation buffer (e.g., the translation buffer 400 of FIG. 4 and/or 600 of FIG. 6) is configured to be aware of internal DRAM and channel structures of example memory modules as disclosed herein. The translation buffer can then re-organize the data blocks from the internal channels as shown in FIG. 9 to the data layouts as shown in FIG. 10 to apply chipkill-correct level ECC.

In some examples, the first translator 420 (FIGS. 4 and 6) causes retrieval of a first chipkill ECC (e.g., E0 of the ECCs 904) corresponding to a first data block 906 of the data 902*a*, the second translator 424 (FIGS. 4 and 6) causes retrieval of a second chipkill ECC (e.g., E1 of the ECCs 904) corresponding to a second data block 908 of the data 902*b*. The first output data synchronization queue 606 (FIG. 6) stores the retrieved first data block 906 with the first chipkill ECC (E0) (denoted by reference numeral 1002 in FIG. 10) to output the first data block 906 and the first chipkill ECC (E0) simultaneously on the narrow external data bus 414 at a first time. In addition, the second output data synchronization queue 608 (FIG. 6) stores the second data block 908 with the second chipkill ECC (E1) (denoted by reference numeral 1004 in FIG. 10) to output the second data block 908 and the second chipkill ECC (E1) simultaneously on the narrow external data bus 414 at a second time different from the first time at which the first data block 906 and the first chipkill ECC (E0) were output.

Figure 11:
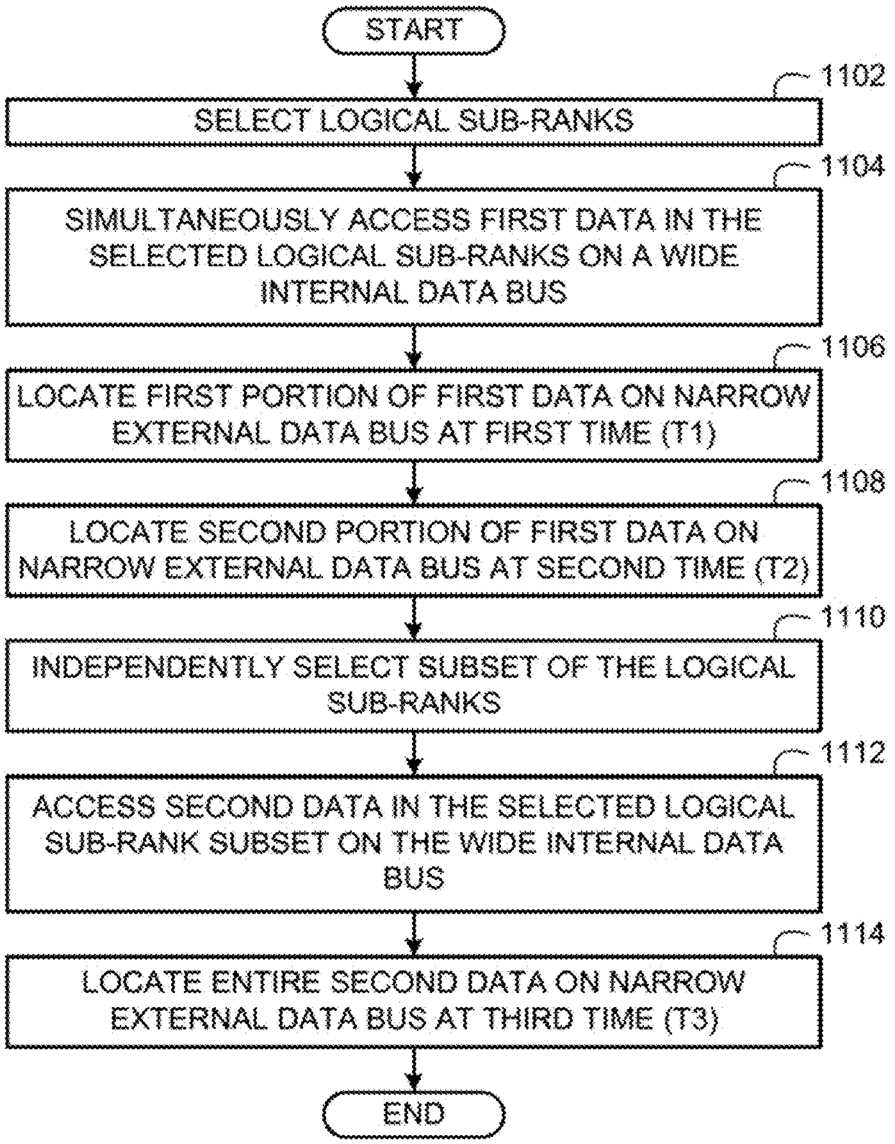
FIG. 11 is a flow diagram representative of instructions and/or actions which may be carried out to perform data accesses in memory modules having a wide internal data bus and a narrow external data bus using examples disclosed herein.

FIG. 11 is a flow diagram representative of instructions and/or actions which may be performed to access data in memory modules having a wide internal data bus and a narrow external data bus using examples disclosed herein. The flow diagram of FIG. 11 is representative of operations to implement the translation buffers 108 (FIG. 1), 208 (FIG. 2), and/or 400 (FIGS. 4 and 6). In this example, the operations are performed by one or more circuits (e.g. logic and/or analog circuits). In some examples, some of the operations are performed based on computer readable instructions executed by the translators 420 and 424 of FIGS. 4 and 6. Such computer readable instructions may be embodied in firmware or software stored on a tangible computer readable storage medium such as a flash, read only memory (ROM), or DRAM, but such some operations and/or parts thereof could alternatively be executed by a device other than the translators 420 and/or 424 and/or embodied in dedicated hardware. Further, although the example operations are described with reference to the flow diagram illustrated in FIG. 11, many other methods of implementing the example translation buffers 108, 208, and/or 400 may alternatively be used. For example, the order of execution of the blocks may be changed, and/or some of the blocks described may be changed, eliminated, or combined.

As mentioned above, example operations of FIG. 11 may be implemented using coded instructions (e.g., computer readable instructions) stored on a tangible computer readable medium such as a flash memory, a read-only memory (ROM), a cache, a random-access memory (RAM) and/or any other storage media in which information is stored for any duration (e.g., for extended time periods, permanently, brief instances, for temporarily buffering, and/or for caching of the information). As used herein, the term tangible computer readable medium is expressly defined to include any type of computer readable storage and to exclude propagating signals. Additionally or alternatively, example operations of FIG. 11 may be implemented using coded instructions (e.g., computer readable instructions) stored on a non-transitory computer readable medium such as a flash memory, a read-only memory, a cache, a random-access memory and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals. As used herein, when the phrase "at least" is used as the transition term in a preamble of a claim, it is open-ended in the same manner as the term "comprising" is open ended. Thus, a claim using "at least" as the transition term in its preamble may include elements in addition to those expressly recited in the claim.

In FIG. 11, initially, the translator(s) 420 and/or 424 (FIGS. 4 and 6) select(s) logical sub-ranks (block 1102). For example, the translator(s) 420 and/or 424 may output an address on the internal address bus(es) 406*a* and/or 406*b* (FIGS. 4 and 6) to select or activate the logical sub-ranks 304*a-b* independent and mutually exclusive of the logical sub-ranks 306*a-b* of FIG. 3 based on an address received at the external address bus 412 (FIGS. 4 and 6). The translation buffer 400 (or 600) simultaneously access first data in the selected logical sub-ranks 304*a-b* on the wide internal data bus 410 (FIGS. 4 and 6) (block 1104). The multiplexer 436 (FIGS. 4 and 6) locates a first portion of the accessed first data on the narrow external data bus 414 (FIGS. 4 and 6) at a first time (T1) (block 1106). The multiplexer 436 locates a second portion of the accessed first data on the narrow external data bus 414 (FIGS. 4 and 6) at a second time (T2) (block 1108). In the illustrated example, the first time (T1) is temporally separate from the second time (T2) (but may occur consecutively without an intervening time delay), the width of the first portion of the first data equals the width of the narrow external data bus 414, and the width of the second portion of the first data also equals the width of the narrow external data bus 414.

The translator(s) 420 and/or 424 (FIGS. 4 and 6) select(s) a subset of the logical sub-ranks 304*a-b* (block 1110). For example, the translator(s) 420 and/or 424 may output an address on the internal address bus 406*a* to select or activate the logical sub-rank 304*a* independent and mutually exclusive of the logical sub-ranks 304*b* and 306*a-b* based on another address received at the external address bus 412. In examples in which the four logical sub-ranks 304*a-b* and 306*a-b* or more are selected at block 1102, less than all of those logical sub-ranks are selected at block 1110. The translation buffer 400 (or 600) access second data in the selected logical sub-rank 304*a* on the wide internal data bus 410 (block 1112). In the illustrated example, the second data is accessed on a smaller portion (e.g., the first internal data bus 408*a* of FIGS. 4 and 6) of the wide internal data bus 410 at block 1112 than the larger portion (e.g., the first and second internal data buses 408*a-b*) used to access the first data at block 1104. In the illustrated example, the multiplexer 436 (FIGS. 4 and 6) locates the entire second data on the narrow external data bus 414 (FIGS. 4 and 6) at a third time (T3) (block 1114). In the illustrated example, the second data is the same width as the width of the narrow external data bus 414. Therefore, only a single data output is needed to transfer the second data on the narrow external data bus 414, whereas two data output cycles were used at blocks 1106 and 1108 to output the first data on the narrow external data bus 414. In addition, the third time (T3) is temporally separate from the first time (T1) and the second time (T2), but the third time (T3) may occur consecutively following the second time (T2) without an intervening time delay. The example method of FIG. 11 then ends.

The method of FIG. 11 may be used for write accesses and/or read accesses to a memory module. The operations of FIG. 11 are arranged for use in read accesses. For use in write accesses, blocks 1106 and 1108 may be performed before blocks 1102 and 1104, and block 1114 may be performed before blocks 1110 and 1112.

Although the above discloses example methods, apparatus, and articles of manufacture including, among other components, software executed on hardware, it should be noted that such methods, apparatus, and articles of manufacture are merely illustrative and should not be considered as limiting. For example, it is contemplated that any or all of these hardware and software components could be embodied exclusively in hardware, exclusively in software, exclusively in firmware, or in any combination of hardware, software, and/or firmware. Accordingly, while the above describes example methods, apparatus, and articles of manufacture, the examples provided are not the only way to implement such methods, apparatus, and articles of manufacture. Thus, although certain methods, apparatus, and articles of manufacture have been described herein, the scope of coverage of this patent is not limited thereto. To the contrary, this patent covers all methods, apparatus, and articles of manufacture fairly falling within the scope of the claims either literally or under the doctrine of equivalents.

What is claimed is:

1. A method to access data comprising:

performing, by a memory device, data access on a first independently selectable logical sub-rank of the memory device to access first data via a first wide internal data bus of the memory device;

performing, on the memory device, access on a second independently selectable logical sub-rank of the memory device to access second data via a second wide internal data bus of the memory device, wherein the first and second data accesses are performed simultaneously;

the memory device having:

a translation buffer chip, memory chips in each of the first and second independently selectable logical sub-ranks, a narrow external data bus to connect the translation buffer chip to a memory controller, and the wide internal data bus between the translation buffer chip and the memory chips of the first and second logical sub-ranks;

interleaving a block of the first data and a block of the second data; and transferring the interleaved block of the first data and the block of the second data on the narrow external data bus as part of a single transfer.

2. A method as defined in claim 1, further comprising wherein the first and second wide internal data buses operate at a lower frequency than the narrow external data bus.

3. A method as defined in claim 2, wherein a width of the wide first and second internal data buses is at least twice a width of the narrow external data bus.

4. An apparatus to access data comprising:

first and second input data synchronization queues located between a narrow external data bus of a memory device and a wide internal data bus of the memory device;

first and second output data synchronization queues located between the narrow external data bus and the wide internal data bus to simultaneously receive first data and second data from the wide internal data bus;

a multiplexer in communication with the first and second output data synchronization queues to locate the first data from the first output data synchronization queue on the narrow external data bus at a first time, and to locate the second data from the second output data synchronization queue on the narrow external data bus at a second time different from the first time;

a first translator located between an external address bus of the memory device and a first internal address bus of the memory device; and a second translator located between the external address bus and a second internal address bus of the memory device, the first and second translators to generate internal data access timings corresponding to memory chips of the memory device different from external data access timings corresponding with data accesses on the narrow external data bus.

5. An apparatus as defined in claim 4, wherein the first data is from a first memory rank and the second data is from a second memory rank, the multiplexer is to output the first data and the second data from the first and second output data synchronization queues to the narrow external data bus while the first and second translators cause retrieval of third data from a third memory rank for storing in the first output data synchronization queue and fourth data from a fourth memory rank for storing in the second output data synchronization queue.

6. An apparatus as defined in claim 4, wherein the external data access timings correspond to a first memory access standard associated with operating the narrow external data bus at a first frequency, and the internal data access timings correspond to a second memory access standard associated with operating the wide internal data bus at a second frequency that is slower than the first frequency.

7. An apparatus as defined in claim 4, wherein the external data access timings correspond to a graphics double data rate (GDDR) dynamic random access memory, and the internal data access timings correspond to one of a double data rate (DDR) dynamic random access memory or a low power double data rate (LPDDR) dynamic random access memory.

8. An apparatus as defined in claim 4, wherein the external data access timings correspond to a double data rate (DDR) dynamic random access memory, and the internal data access timings correspond to one of a double data rate (DDR) dynamic random access memory; a low power double data rate (LPDDR) dynamic random access memory; or non-volatile memory including a phase-change random access memory, spin-torque transfer random access memory, or a memristor memory.

9. An apparatus as defined in claim 4, wherein the external data access timings correspond to a low power double data rate, version two, (LPDDR2) dynamic random access memory, and the internal data access timings correspond to a lower power double data rate (LPDDR) dynamic random access memory.

10. An apparatus as defined in claim 4, wherein the external data access timings correspond to a non-industry-standard memory interface associated with operating the narrow external data bus at a first frequency, and the internal data access timings correspond to an industry-standard memory interface associated with operating the wide internal data bus at a second frequency that is slower than the first frequency.

11. An apparatus as defined in claim 4, wherein the first translator is to cause retrieval of a first chipkill error correcting code corresponding to the first data from the memory device, the second translator to cause retrieval of a second chipkill error correcting code corresponding to the second data from the memory device, the first output data synchronization queue to store the first data with the first chipkill error correcting code to output the first data and the first chipkill error correcting code simultaneously on the narrow external data bus, and the second output data synchronization queue to store the second data with the second chipkill error correcting code to output the second data and the second chipkill error correcting code simultaneously on the narrow external data bus.

12. A memory module comprising:

a buffer to be in communication with an external data bus and an external address bus of a memory controller; and a plurality of memory chips communicatively coupled to the buffer via corresponding internal data buses and internal address buses, the buffer to:

retrieve first data and second data from first ranks of the memory chips with a first time delay between retrieval of the first and second data, retrieve third data and fourth data from second ranks of the memory chips with a second time delay between retrieval of the third and fourth data, and output the first, second, third, and fourth data on the external data bus without any time delay between any of the first, second, third, and fourth data, wherein the buffer is to initiate retrieval of the first, second, third, and fourth data in response to a burst command on the external address bus, and the buffer is to retrieve the first, second, third, and fourth data by sending a burst chop command simultaneously to the first and second memory ranks.

13. A memory module as defined in claim 12, wherein the first and second time delays are burst chop four (BC4) penalties associated with retrieving the first, second, third, and fourth data using a burst chop four command.

14. A memory module as defined in claim 12, further comprising data output synchronization queues to buffer the first, second, third, and fourth data before outputting the first, second, third, and fourth data on the external data bus without any time delay between any of the first, second, third, and fourth data.

* * * * *